(12) United States Patent
Knuutila et al.

(10) Patent No.: US 6,819,937 B2
(45) Date of Patent: Nov. 16, 2004

(54) DATA TRANSMISSION IN A TDMA SYSTEM

(75) Inventors: Jarno Knuutila, Tampere (FI); Jari Hamalainen, Kanagasala As (FI); Ari Aho, Tampere (FI); Markku Lipponen, Tampere (FI); Ari Salminen, Salo (FI)

(73) Assignee: Nokia Corporation, Espoo (FI)

( * ) Notice: Subject to any disclaimer, the term of this patent is extended or adjusted under 35 U.S.C. 154(b) by 60 days.

(21) Appl. No.: 10/052,263

(22) Filed: Jan. 23, 2002

(65) Prior Publication Data

US 2002/0131396 A1 Sep. 19, 2002

Related U.S. Application Data

(63) Continuation-in-part of application No. 09/342,843, filed on Jun. 29, 1999.

(30) Foreign Application Priority Data

Jun. 30, 1998 (GB) .............................................. 9814080

(51) Int. Cl.[7] .............................................. H04B 7/00
(52) U.S. Cl. .................... 455/522; 455/456.2; 455/436; 455/435.1
(58) Field of Search ............................... 455/69, 575.1, 455/88, 456.2, 403, 420, 434, 422.1, 440, 423, 424, 425, 436, 443, 455, 522, 445, 509, 450, 561, 515, 516, 456.1, 453.1; 370/345, 331–335, 342, 348, 330, 337, 347, 442, 468, 349, 321, 328, 329

(56) References Cited

U.S. PATENT DOCUMENTS 4,613,990 A * 9/1986 Halpern ...................... 455/522
5,357,513 A * 10/1994 Kay et al. ................... 370/95.3
5,815,820 A * 9/1998 Kiem et al. .................. 455/575
5,940,743 A * 8/1999 Sunay et al. .................. 455/69
6,006,093 A * 12/1999 Aalto et al. .................. 455/443
6,029,074 A * 2/2000 Irvin ........................... 455/571
6,104,929 A * 8/2000 Josse et al. .................. 455/445

FOREIGN PATENT DOCUMENTS

GB         2244409 A   * 11/1991    ............ H04Q/7/04

* cited by examiner

Primary Examiner—Quochien B. Vuong
Assistant Examiner—C. Chow
(74) Attorney, Agent, or Firm—Antonelli, Terry, Stout & Kraus, LLP

(57) ABSTRACT

A method and apparatus for updating transmission power class information of a Mobile Station (MS) in a General Packet Radio Services (GPRS) network. The invention updates transmission power class information of the MS in the GPRS network by initiating a Routing Area Update (RAU) procedure in the MS. The RAU procedure includes sending from the MS to a Serving GPRS Support Node (SGSN) of the GPRS network a RAU request message including a MS Radio Access Capability (RAC) Information Element (IE) which includes an IE indicating a new transmission power class of the MS, accepting in the SGSN the IE indicating a new transmission power class of the MS included in the MS RAC of the RAU request message, and delivering to a Base Station (BSS) the IE indicating a new transmission power class of the MS, thereby updating the transmission power class information of the MS at the BSS.

27 Claims, 7 Drawing Sheets

FIG. 4

Table 9.4.14/GSM 04.08: ROUTING AREA UPDATE REQUEST message content

| IEI | Information Element | Type/Reference | Presence | Format | Length |
|---|---|---|---|---|---|
| | Protocol discriminator | Protocol discriminator 10.2 | M | V | 1/2 |
| | Skip indicator | Skip indicator 10.3.1 | M | V | 1/2 |
| | Routing area update request message identity | Message type 10.4 | M | V | 1 |
| | Update type | Update type 10.5.5.18 | M | V | 1/2 |
| | GPRS ciphering key sequence number | Ciphering key sequence number 10.5.1.2 | M | V | 1/2 |
| | Old routing area identification | Routing area identification 10.5.5.15 | M | V | 6 |
| | MS Radio Access capability | MS Radio Access capability 10.5.5.12a | M | LV | 6 - 13 |
| 19 | Old P-TMSI signature | P-TMSI signature 10.5.5.8 | O | TV | 4 |
| 17 | Requested READY timer value | GPRS Timer 10.5.7.3 | O | TV | 2 |
| 27 | DRX parameter | DRX parameter 10.5.5.6 | O | TV | 3 |
| 9- | TMSI status | TMSI status 10.5.5.4 | O | TV | 1 |
| 31 | MS network capability | MS network capability 10.5.5.12 | O | TLV | 3-4 |

FIG. 5a

Table 10.5.146/GSM 04.08: *Mobile Station Radio Access Capability* Information Element

```
< MS Radio Access capability IE > ::=
<MS Radio Access capability IEI : 00100100 >
<Length of MS RA capability: <octet>>   -- length in octets of MS RA capability value part and spare bits
<MS RA capability value part : < MS RA capability value part struct >>
<spare bits>**; -- may be used for future enhancements <MS RA capability value part struct >::=   --recursive structure allows any number of Access technologies
< Access Technology Type: bit (4) >
< Access capabilities : <Access capabilities struct> >
{ 0 | 1 <MS RA capability value part struct> } ;

< Access capabilities struct > ::=
        < Length : bit (7) > -- length in bits of Content and spare bits
        <Access capabilities : <Content>>
        <spare bits>** ; -- expands to the indicated length
                         -- may be used for future enhancements < Content > ::=
        < RF Power Capability : bit (3) >
        { 0 | 1 <A5 bits : <A5 bits> > } -- zero means that the same values apply for parameters as in the
immediately preceeding Access capabilities field within this IE
        -- The presence of the A5 bits is mandatory in the 1st Access capabilies struct within this IE.
        < ES IND : bit >
        < PS : bit >
        < VGCS : bit >
        < VBS : bit >
        { 0 | 1 < Multislot capability : Multislot capability struct > } ; -- zero means that the same values apply
for multislot parameters as in the immediately preceeding Access capabilities field within this IE.
        -- The presence of the Multislot capability struct is mandatory in the 1st Access capabilies struct within this
IE.

< Multislot capability struct > ::=
        { 0 | 1 < HSCSD multislot class : bit (5) > }
        { 0 | 1 < GPRS multislot class : bit (5) > < GPRS Extended Dynamic Allocation Capability : bit > }
        { 0 | 1 < SMS_VALUE : bit (4) > < SM_VALUE : bit (4) > } ;

<A5 bits> ::= < A5/1 : bit> <A5/2 : bit> <A5/3 : bit> <A5/4 : bit> <A5/5 : bit> <A5/6 : bit> <A5/7 : bit>; -- bits for
circuit mode ciphering algorithms
```

FIG. 5b

Table 10.5.146/GSM 04.08 (continued): *Mobile Station RadioAccess Capability* Information Element

Access Technology Type
This field indicates the access technology type to be associated with the following access capabilities.

Bits
4 3 2 1
0 0 0 0   GSM P
0 0 0 1   GSM E -- note that GSM E covers GSM P
0 0 1 0   GSM R -- note that GSM R covers GSM E and GSM P
0 0 1 1   GSM 1800
All other values are treated as unknown by the receiver.

RF Power Capability
This field is coded as radio capability in Classmark 3 for the indicated band: it contains the binary coding of he power class associated (see GSM 05.05 paragraph 4.1 output power and paragraph 4.1.1 Mobile Station).

A5/1
0   encryption algorithm A5/1 not available
1   encryption algorithm A5/1 available
A5/2
0   encryption algorithm A5/2 not available
1   encryption algorithm A5/2 available
A5/3
0   encryption algorithm A5/3 not available
1   encryption algorithm A5/3 available
A5/4
0   encryption algorithm A5/4 not available
1   encryption algorithm A5/4 available
A5/5
0   encryption algorithm A5/5 not available
1   encryption algorithm A5/5 available
A5/6
0   encryption algorithm A5/6 not available
1   encryption algorithm A5/6 available
A5/7
0   encryption algorithm A5/7 not available
1   encryption algorithm A5/7 available

.

ES IND – (Controlled early Classmark Sending)
0   "controlled early Classmark Sending" option is not implemented
1   "controlled early Classmark Sending" option is implemented PS – (Pseudo Synchronisation)
0   PS capability not present
1   PS capability present VGCS – (Voice Group Call Service)
0   no VGCS capability or no notifications wanted
1   VGCS capability and notifications wanted VBS – (Voice Broadcast Service)
0   no VBS capability or no notifications wanted
1   VBS capability and notifications wanted

FIG. 5c

Table 10.5.146/GSM 04.08 (concluded): *Mobile Station Radio Access Capability* Information Element

HSCSD Multi Slot Class
The Multi Slot Class field is coded as the binary representation of the multislot class defined in TS GSM 05.02.
Range 1 to 18, all other values are reserved.
GPRS Multi Slot Class
The GPRS Multi Slot Class field is coded as the binary representation of the multislot class defined in TS GSM 05.02.
GPRS Extended Dynamic Allocation Capability
0    Extended Dynamic Allocation Capability for GPRS is not implemented
1    Extended Dynamic Allocation Capability for GPRS is implemented < MS Measurement capability > ::=
                < SMS_VALUE : bit (4) >
                < SM_VALUE : bit (4) > ;
SMS_VALUE (Switch-Measure-Switch) (4 bit field)
The SMS field indicates the time needed for the mobile station to switch from one radio channel to another, perform a neighbor cell power measurement, and the switch from that radio channel to another radio channel.
Bits
4 3 2 1
0 0 0 0         1/4 timeslot (~144 microseconds)
0 0 0 1         2/4 timeslot (~288 microseconds)
0 0 1 0         3/4 timeslot (~433 microseconds)
. . .
1 1 1 1         16/4 timeslot (~2307 microseconds)
(SM_VALUE) Switch-Measure (4 bit field)
The SM field indicates the time needed for the mobile station to switch from one radio channel to another and perform a neighbor cell power measurement.
Bits
4 3 2 1
0 0 0 0         1/4 timeslot (~144 microseconds)
0 0 0 1         2/4 timeslot (~288 microseconds)
0 0 1 0         3/4 timeslot (~433 microseconds)
. . .
1 1 1 1         16/4 timeslot (~2307 microseconds)

DATA TRANSMISSION IN A TDMA SYSTEM

CROSS REFERENCE TO RELATED APPLICATION

This a Continuation-in-Part of application Ser. No. 09/342,843 filed Jun. 29, 1999, entitled "DATA TRANSMISSION IN A TDMA SYSTEM" by J. Knuutila, et al. and the contents of said application is incorporated herein by reference.

BACKGROUND TO THE INVENTION

The present invention relates to a method and apparatus for data transmission by a MS in a Time Division Multiple Access (TDMA) system. More specifically, the present invention relates to providing power information concerning the mobile station (MS) to the mobile network to implement multi-slot transmission of data services in such a system.

TDMA is a fundamental digital telecommunication technology and forms the basis of cellular standards such as Global System for Mobile Communications (GSM). A TDMA system includes the basic subsystems of cellular radio systems including a switching network, base stations (BSS's) and MSs. In a TDMA system the radio spectrum is divided into radio carrier frequencies typically spaced 30 kHz to 200 kHz apart. Digital techniques are employed at the BSS and in the cellular radio to subdivide the time on each radio channel into time slots, i.e. the TDMA radio carrier waveform is divided into several different types of control and voice/data channels by the use of different time slots or shared portions of time slots.

Time slots are the smallest individual time periods available to each MS. Each time slot can be assigned to a different MS, and the time slots can be dedicated or dynamically assigned. Voice or data information as well as access information are converted to digital information that is sent and received in bursts during the time slots. The entire repeating pattern of the time slots is called a frame, which includes eight time slots. Thus, TDMA systems allow several MS's to operate simultaneously on a single radio carrier frequency because the MS's share the radio frequency by dividing their signals into slots.

Data services ordinarily are communicated in the same way as voice signals, that is they are assigned a particular individual time slot in a frame and share a single bandwidth radio carrier with other users. However, whilst the transfer of voice signals must be on a real time basis (instantaneous), certain data services can be transferred on a non-real time basis (stored or delayed).

Non-real time operability of data services allows transmission of the information to be treated with increased flexibility. This has led recently to the development of multi-slot data transfer capability. Multi-slot transmission is facilitated by the network, typically the BSS, which controls channel allocation to users.

Communication to effect data services can also be implemented in a packet switched network which could for example operate according to the General Packet Radio Services (GPRS) standard or High Speed Circuit Switched Data (HSCSD). GPRS uses a packet mode technique to transfer high-speed and low speed data using packets in one or more time slots per frame. Communication in a packet switched network operated is implemented using two network nodes, a Serving Support Node and a Gateway Support Node. These nodes correspond to a Serving GPRS Support Node (SGSN) and a Gateway GPRS Support Node (GGSN) in a GPRS network.

The SGSN of the GPRS network keeps track of the MS's locations and performs security functions and access control and is connected to the BSS. The GGSN of the GPRS network provides interworking with external packet switched networks and is connected to the SGSN. HSCSD is based on the use of up to 8 time slots per TDMA frame for one communication, thus providing for higher data transmission speeds. Typical applications of HSCSD include, facsimile, file transfer, electronic mail, video and distribution services. The discussion below shall proceed based on the use of a GPRS network. Similar concepts apply to HSCSD.

In a GPRS network information is provided for the MS to be able to detect predetermined states or conditions of the MS and determine when to perform a Routing Area Update (RAU) procedure. These predetermined states could for example include a state where a new cell or a new Routing Area (RA) has been entered by the MS. The MS detects that a new RA has been entered by comparing the Routing Area Identity (RAI) stored in the MS with that received from the new cell.

Other predetermined states that may cause a RAU procedure to be conducted could for example be when the periodic RA update timer has expired, when a suspended MS is not resumed by the BSS, etc.

When a RAU request is issued by the MS, the SGSN detects whether the RAU request is an intra SGSN RAU or an inter SGSN RAU by determining whether it also handles the old RA. In the case of an intra SGSN RAU, the SGSN has the necessary information about the MS and there is no need to inform the GGSNs or the HLR about the new MS location. A RA update is always an intra SGSN routing area update.

A normal Intra SGSN RAU procedure as illustrated in FIG. 1 includes the following. The MS sends a RAU Request (old RAI, old P-TMSI Signature, Update Type) to the SGSN (Step 1). The Request indicates whether it is a normal RAU, periodic RAU or combined LA/RA update. The BSS adds the Cell Global Identity including the Radio Access Capability (RAC) of the cell where the message was received before passing the message to the SGSN. Security functions are executed if implemented in the network (Step 2). The SGSN validates the presence of the MS in the new RA (Step 3). If due to regional subscription restrictions the MS is not allowed to be attached in the RA, or if subscription checking fails, then the SGSN rejects the RAU with an appropriate cause. If all checks are successful then the SGSN updates the Mobility Management (MM) context for the MS. A RAU Accept (P-TMSI, P-TMSI Signature) is returned to the MS. If P-TMSI was reallocated, the MS acknowledges the new P-TMSI by returning a RAU Complete message to the SGSN (Step 4). If the RAU procedure fails a maximum allowable number of times, or if the SGSN returns a RAU Reject (Cause) message, the MS shall enter IDLE state.

A normal Inter SGSN RAU procedure is similar to the normal Intra SGSN RAU procedure except that communications are performed between the new SGSN and the old SGSN and the GGSN and the Home Location Register (HLR) so as to transfer and update context and location information regarding the MS in the new SSGN, the GGSN and the HLR.

Current design of the transmitter of a MS does not allow it to satisfactorily cope with multi-slot transmission. One particular drawback is that the output RF power amplifier in standard TDMA MSs are designed to transmit at a rate of one slot per frame. In multi-slot transmission, driving the power amplifier at increased rates introduces new design challenges. Specifically, the power amplifier of the transmitter accordingly is driven at an increased rate compared to normal transmission at one slot per frame. These longer transmission periods may cause higher Specific Absorption Rate (SAR) values and in rare instances the measured SAR values might exceed predetermined limits. SAR values assess levels of human exposure to radio signals from wireless communications devices deemed to be appropriate by various standards organizations.

In multi-slot transmission operation, the transmitter outputs on more than one time-slot per TDMA frame. Thus, the power amplifier of the transmitter is driven at an increased rate compared to normal transmission at one slot per frame. This leads to an increase in the operating temperature of the power amplifier, which can introduce problems due to the thermal effects. For example, if the junction temperature of the RF power amplifier exceeds its upper rating, then changes could occur in the amplifier's operating characteristics. If multi-slot transmission is sustained the temperature of the power amplifier will continue to rise and if left unchecked, the rise in operating temperature of the power amplifier could possibly lead to irreversible damage.

The rise in temperature of the power amplifier could also negatively affect other elements of the MS, such as the battery, display, IC chips, housing, etc. For example, continuous heating of the battery could damage the battery or cause the battery to drain faster than normal. Therefore, the transmission power of the MS is monitored so as to prevent the MS from exceeding its maximum allowed transmission power. Accordingly, a solution to this problem is important.

One approach to solving this problem could be to increase the power amplifier capacity and introduce further heat sinks in the MS. However, this would necessitate an increase in the size of the MS, which would be undesirable given the general trend towards more compact MSs. Another approach to solving this problem is to limit the power output of the power amplifier while continuing to transmit in the multi-slot mode by controlling the maximum allowed output power levels.

The maximum allowed power output of a MS transmitter depends on its allocated power classification, which is network controlled. The network chooses the transmission power of the MS, and commands to regulate it are issued to the MS. The network determines the required MS transmission power through reception level measurements performed at the BSS, taking into account the MS maximum transmission power as well as quality measurements done by the network. This last parameter helps to ensure that transmission quality is kept above some acceptable threshold. This information is used for power control and handover preparation.

GSM has five power classmarks defining respective maximum output powers. Typical classes in GSM900 are class 2 for transportable mobile telephones (e.g. vehicle-mounted equipment) with a maximum power output of 8 watts; hand portables are classified 3 through to 5 with maximum power outputs ranging from 5 to 0.8 watts.

Whilst the classmark is sent by the MS in the initial message at the beginning of the data transmission, it may happen that the classmark changes during the transmission. To implement this change a classmark change procedure must be executed. In the GSM specification the classmark change procedure is described in GSM 04.08 in section 3.4.10. For a packet switched MS which operates for example according to the GPRS standard in a GPRS Network, multi-slot communication can be conducted with the GPRS network (i.e., GPRS attached). However, it may happen that the transmission power class of the GPRS MS need to be changed and indicated according to a user situation when, for example, an external interface (IR, Bluetooth) is used.

In conventional apparatus GPRS communication with the GPRS Network has to be terminated (GPRS Detached) and re-established (GPRS Attached) when the transmission power class change need to be indicated to the network. In conventional GSM apparatus the transmission power class change can be accomplished using the classmark change procedure, which is performed between the MS and MSC. However, the classmark change procedure cannot be utilized in a GPRS Network since nodes SGSN, GGSN are used. In GPRS, the MSC is not involved in GPRS signaling, only the SGSN and GGSN. Further, the RAU procedure does not provide a mechanism to change the transmission power class when a RAU is conducted. Therefore, in a GPRS Network a mechanism for indicating a transmission power class change during the GPRS attached is needed.

SUMMARY OF THE INVENTION

The present invention proposes that a MS use the RAU procedure to indicate the transmission power class change to the SSN of a packet switched network. The present invention could, for example, be implemented in a GPRS network wherein the MS uses the RAU procedure to indicate the transmission power class change to the SGSN during the GPRS attached. The SGSN then conveys the transmission power class change to the BSS.

According to the present invention the MS is allowed to indicate a new transmission power class in the MS RAC field of a RAU Request message sent to the SGSN during a RAU procedure. The RAU Request message of the RAU procedure contains a field having Update Type information, which indicates whether the MS is requesting a normal RAU procedure, a periodic RAU procedure or combined RA/LA update procedure. Any of these can be used to indicate a transmission power class change in the MS or new Update Type can be introduced for this purpose. If the RAU Request message provides a new transmission power class of the MS, then the SGSN shall accept the new transmission power class and deliver the new transmission power class information to the BSS.

BRIEF DESCRIPTION OF THE DRAWINGS

The invention will now be described by way of example, with reference to the accompanying drawings in which:

FIG. 4 is schematic diagram illustrating the Information Element (IE) fields of the RAU request message; and FIGS. 5*a–c* are schematic diagrams illustrating the IE fields of the MS RAC of the RAU request message.

DETAILED DESCRIPTION OF THE DRAWINGS

Figure 1:
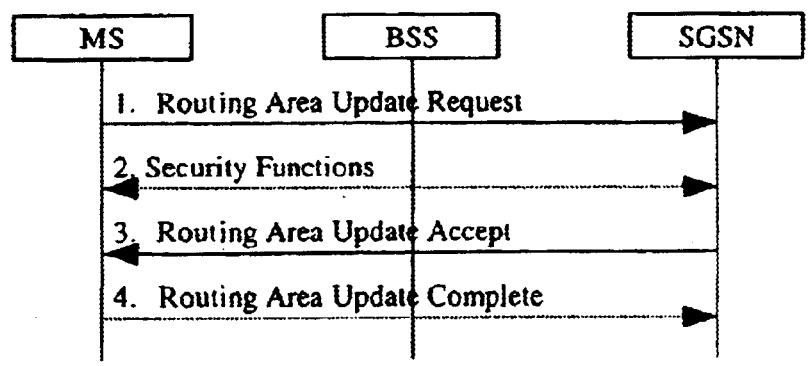
FIG. 1 is a signal flow diagram illustrating the current RAU procedure.

The present invention proposes that a MS use the RAU procedure to indicate the transmission power class change to the Serving Support Node of a packet switched network. The present invention could for example be applied to a GPRS network and therefore would indicate the transmission power change to the SGSN during the GPRS attached. The SGSN then conveys the transmission power class change to the BSS. Although the present invention will be described below with respect a GPRS network, it should be noted that the present invention could be used with any type of packet switched network. For the sake of convenience the present invention is described using a GPRS network. However, the present invention is not limited to such an embodiment.

Prior to explaining the details of the present invention a description of a GPRS network, the details of a MS and basic procedures performed in the GPRS and MS will be provided. It should be noted that the embodiments of the present invention as described herein and as illustrated in the drawings are examples of the present invention. The present invention is not limited to these embodiments.

Figure 2:
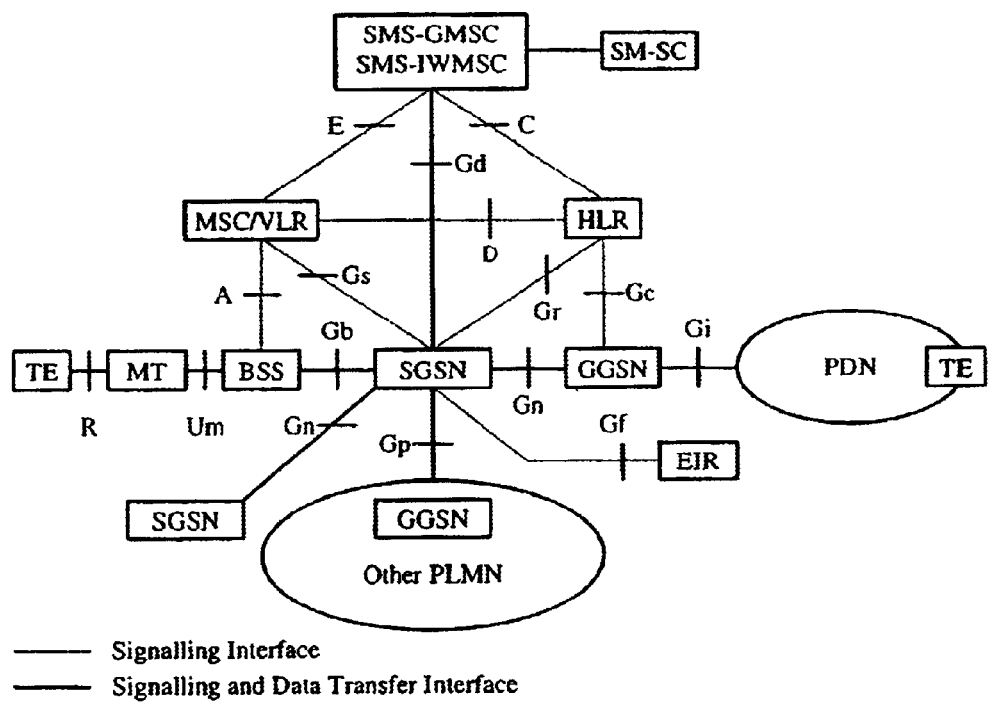
FIG. 2 is a schematic diagram illustrating the general architecture of a GPRS network.

An example of a GPRS network architecture supporting the GPRS standard is set forth as the wireless communications network illustrated in FIG. 2. The various elements of the GPRS network and their functions may, but need not, be those described in the 3rd Generation Partnership Project, Technical Specification Group Services and System Aspects, General Packet Radio Service (GPRS), Service description, Stage 2 (Release 1997), 3GPP TS 03.60, Version 6.8.0 (2001–03), published by the 3rd Generation Partnership Project (3GPP). The elements and their functions may instead be those described in an earlier or later version of the 3GPP TS 03.60 specifications or may be those of any other known packet switched wireless communications network. The description of network elements and their functions hereby incorporated by reference is merely a non-limiting example of packet switched wireless communication networks.

Several elements of the example GPRS network illustrated in FIG. 2 are particularly relevant to the present invention. The Mobile Terminal (MT), referred to herein as a MS, is only one possible part of User Equipment (UE). Typically, Terminal Equipment (TE) used together with a Mobile Terminal (MT) constitutes User Equipment (UE). Any UE may be utilized in conjunction with this invention so that it operates or can be programmed to operate in the GPRS network. In the GPRS network the BSS, SGSN, GGSN and the MSC, VLR and HLR manage and control the radio access between the network and a number of UEs.

The SGSN is the node that serves the MSs. At GPRS attach, the SGSN establishes a mobility management context containing information pertaining to mobility, security, etc. for the MS. At Packet Data Protocol (PDP) context activation, the SGSN establishes a PDP context, to be used for user data routing purposes, with the GGSN that the subscriber will be using.

The GGSN is the node accessed by the packet switched network to communicate with MSs in the GPRS network. The GGSN contains routing information for the GPRS attached MS. The routing information is used to tunnel Protocol Data Units (PDUs) to the SGSN. The SGSN and GGSN functionalities may reside in different physical nodes or combined in the same physical node.

Figure 3:
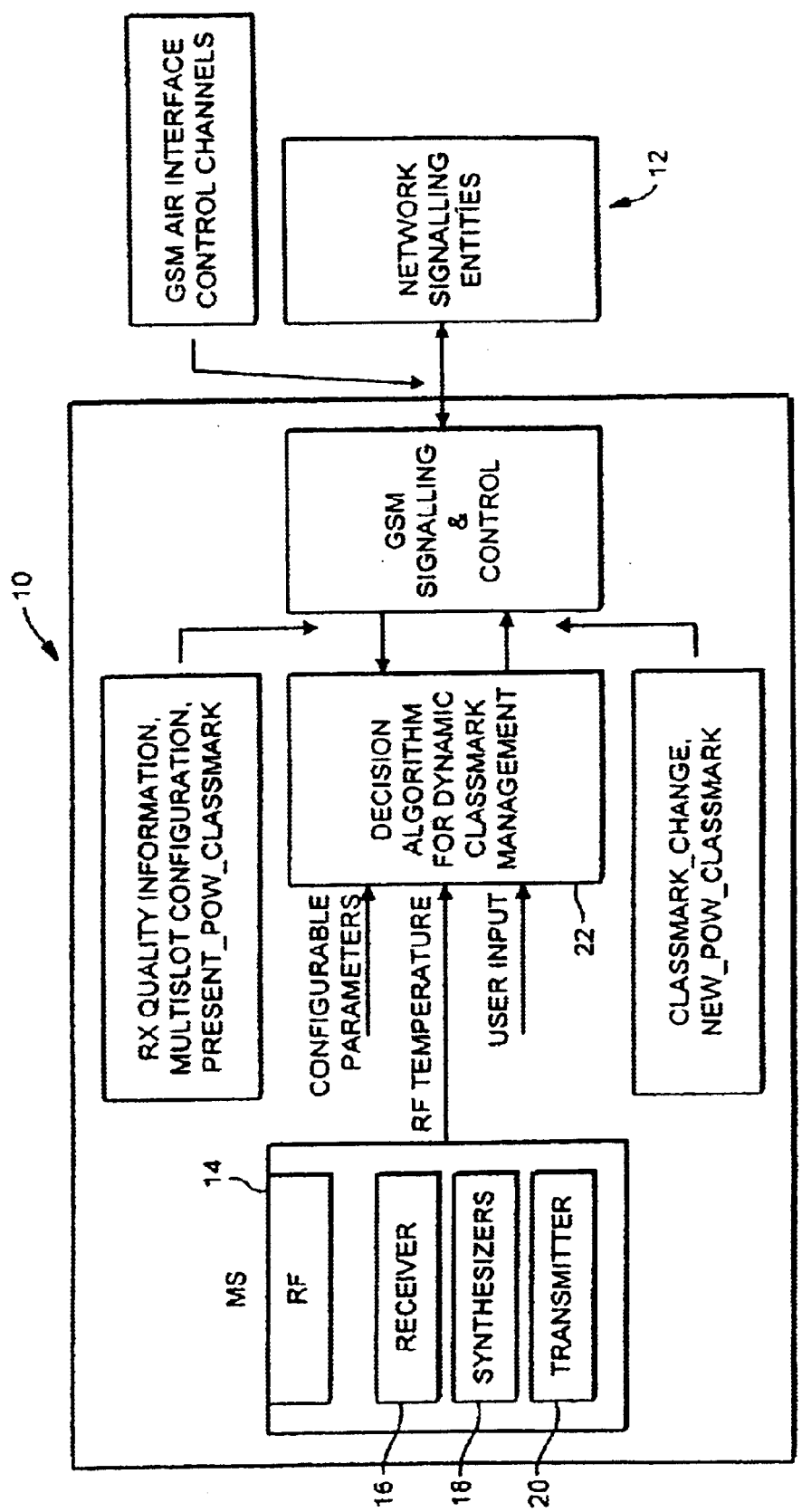
FIG. 3 is a schematic diagram illustrating the internal structure of a MS.

The MS 10 as illustrated in FIG. 3 is equipped with the standard features associated with a mobile communication device: a keypad for dialing numbers, accepting a call, terminating a call, storing telephone numbers, and so on; a microphone for converting sound pressure, waves into electrical signals, and a loudspeaker for converting electrical signals into sound pressure waves; an antenna for radiating electromagnetic waves at transmission frequencies during transmission, and during reception for converting received electromagnetic waves at reception frequencies into electrical signals. The MS 10 also includes an RF block 14 comprising a receiver 16, synthesizers 18 and a transmitter 20.

It has previously been explained that in a TDMA system, and in particular GSM, a recent development in data services has been that of multi-slot transmission. In a multi-slot transmission operation, the transmitter 20 outputs on more than one time-slot per TDMA frame. The power amplifier of the transmitter accordingly is driven at an increased rate compared to normal transmission at one slot per frame. These longer transmission periods may cause higher Specific Absorption Rate (SAR) values and in rare instances the measured SAR values might exceed predetermined limits. Thus, the transmission power of the MS is monitored so as to prevent the MS from exceeding its maximum allowed transmission power. The network determines the required MS transmission power through reception level measurements performed at the BSS, taking into account the MS maximum transmission power as well as quality measurements done by the network. However, it may happen that the transmission power class of the GPRS MS need to be changed and indicated according to a user situation when, for example, an external interface (IR, Bluetooth) is used.

In GPRS communication, the MS delivers its Radio Access Capabilities (RAC), including information about its power class in a GPRS attach procedure. This procedure is carried out when the MS initiates the GPRS "session". This information is stored in the SGSN and the SGSN delivers it to the BSS system when the mobile moves around the network. The RAC information is also provided to the SGSN by the MS in the Routing Area Update (RAU) procedure, when a predetermined state in the MS occurs. It should also be noted that the MS could for example provide the RAC information in the Routing Area Update (RAU) procedure at any time a power class update is needed without regard to the occurrence of a predetermined state (e.g., if the MS starts to use multi-slot configuration and the power class needs to be decreased).

The predetermined state of the MS could for example occur when the MS is moving around the network, when said MS moves to a new Routing Area (RA), or when a timer in the MS reaches a pre-set value. It is also possible that the MS RAC information is delivered by the MS to the BSS when the MS enters the GPRS transfer mode, namely every time the MS is to send or receive data and when a physical radio channel is needed. This can be done for example in the Packet Resource Request message that is transmitted on the Packet Associated Control Channel (PACCH). These kinds of messages may be transmitted on the channel given for the MS, instead of user data messages.

According to the present invention the RAU procedure can be used to allow the MS to change its power class dynamically and indicate such change to the SGSN. According to the present invention when the RAU procedure illustrated in FIG. 1 is conducted a RAU Request message is sent. The RAU Request message contains various Information Element (IE) fields as illustrated in FIG. 4. The RAU Request message includes various IE fields including a Protocol Discriminator, Skip Indicator, RAU Request Message Identity, Update Type, GPRS Ciphering Key Sequence Number, Old RA Identification, MS RAC, Old P-TMSI Signature, Requested READY Timer Value, DRX Parameter, TMSI Status, and MS Network Capability as set forth in the 3rd Generation Partnership Project (3GPP), Technical Specification Group Core Network, Digital cellular telecommunications system (Phase 2+), Mobile radio interface layer 3 specification, 3GPP TS 04.08 V6.14.0 (2001–04) (Release 1997).

The Protocol Discriminator IE shall be included by the MS to indicate the Protocol Discriminator values to the GPRS network. The Skip Indicator IE provides an indication as to whether the message can be ignored or not. The RAU Request Message Identity IE shall be included by the MS to indicate what type of message is being sent. The Update Type IE indicates whether the MS is requesting a normal RAU procedure or a Periodic RAU procedure. The GPRS Ciphering Key Sequence Number IE shall be included by the MS to make it possible for the network to identify the ciphering key Kc which is stored in the MS without invoking the authentication procedure. The GPRS Ciphering Key Sequence Number is allocated by the GPRS network and sent with the AUTHENTICATION REQUEST message to the MS where it is stored together with the calculated ciphering key Kc. The Old RA Identification IE is to provide an unambiguous identification of routing areas within the area covered by the GPRS network. The MS RAC IE shall be included by the MS is to provide the radio part of the GPRS network with information concerning radio aspects of the MS including the transmission power class information. The Old P-TMSI signature information element IE is included by the MS if it was received from the network in an ATTACH ACCEPT or RAU accept message. The Requested READY timer value IE may be included if the MS wants to indicate a preferred value for the READY timer. The DRX parameter IE may be included if the MS wants to indicate new DRX parameters. The TMSI status IE shall be included if the MS performs a combined RAU and no valid TMSI is available. The MS network capability IE shall be included by the MS to indicate it's capabilities to the network, if the MS supports in addition to GEA/1 at least one of the GPRS Encryption Algorithm GEA/2 to GEA/7.

The present invention proposes that the MS indicate a change in transmission power class and provide information of the new transmission power class in the MS RAC IE of the RAU Request message. Also the Update Type IE can also indicate to the GPRS network whether the RAU request message provides information of a transmission power class change. Such can be indicated in either the Update Type IE when it indicates that a normal RAU procedure is to be conducted or the Update Type IE when it indicates that a periodic RAU procedure is the be conducted. Alternatively a new value for the Update Type IE could be provided to indicate that a change in the transmission power class in the MS has occurred and a new transmission power class is being provided according to the invention.

The MS RAC field includes various IE fields as illustrated in FIGS. 5a–c. As per FIG. 5a one of the IE elements of the MS RAC includes a RF Power Capability IE which according to the present invention is used to indicate new transmission power class information. The SGSN upon receipt of a RAU request message having a MS RAC with new transmission power class information in the RF Capability IE accepts the new transmission class information and delivers it to the BSS. Particularly the SGSN delivers the new transmission power class information to the BSS included within the MS RAC into the next DL Data PDU message (BSSGP message) sent to the BSS or by sending a RA_Capability_PDU message (BSSGP message) to the BSS. The DL Data PDU and the RA_Capability_PDU message are both messages already in existence. It should be noted that the DL Data PDU and RA_Capability_PDU are used for purposes other than the RAU procedure. However, the present invention makes use of these messages so as to update the network as to a change in the transmission power class of the MS.

It should noted that whilst the features of the present invention of supplying information of a new transmission power class in the RAU request message of a RAU procedure have been described in the context of a portable radio communication device, namely a MS, and a GPRS network, such method, apparatus and system, and indeed aspects of the method, apparatus and system, can be implemented and supported by other methods, apparatuses and systems. Furthermore, it will be readily understood that alternative arrangements to those described above with reference to the above described specific embodiments can be made within the inventive concept as defined in the appended claims.

What is claimed is:

1. A method of updating transmission power class information of a Mobile Station (MS) in a packet switched network comprising:

updating transmission power class information of the MS in the network by initiating a Routing Area Update (RAU) procedure in the MS, wherein said RAU procedure comprises:

sending from said MS to a Serving Support Node (SSN) of the network a RAU request message including a MS Radio Access Capability (RAC) Information Element (IE) which includes a field indicating a new transmission power class of the MS, accepting in said SSN said IE indicating a new transmission power class of the MS included in said MS RAC of the RAU request message, and delivering to a Base Station (BSS) the IE indicating a new transmission power class of the MS, thereby updating the transmission power class information of the MS at the BSS, wherein the delivering to the Base Station (BSS) the IE indicating the new transmission power class of the MS, thereby updating the transmission power class information of the MS at the BSS occurs during a transmission.

2. A method according to claim 1, wherein said updating step is performed upon occurrence of a predetermined state.

3. A method according to claim 2, wherein said predetermined state occurs when said MS moves to a new Routing Area (RA).

4. A method according to claim 2, wherein said predetermined state occurs periodically when a timer in the MS reaches a pre-set value.

5. A method according to claim 1, wherein said RAU request includes one of first information indicating whether said RAU procedure is a normal RAU procedure, second information indicating whether said RAU procedure is a periodic RAU procedure, or third information indicating whether said RAU procedure is a combined RA/Location Area (LA) procedure.

6. A method according to claim 1, said RAU request includes information of a New Update Type field indicating that said RAU procedure is used for updating the network with new power class information.

7. A method according to claim 1, wherein said SGSN provides new power class information to said BSS.

8. A method according to claim 1, wherein said SSN can use either a DL Data PDU or RA_Capability_PDU messages to deliver the new power class of the MS to the BSS.

9. A method according to claim 1, wherein the network is a General Packet Radio Services (GPRS) network and said SSN is a Serving GPRS Support Node (SGSN).

10. A packet switched network having a function of updating transmission power class information, comprising:

at least one Mobile Station (MS);

a Serving Support Node (SGSN); and a Base Station (BSS), wherein transmission power class information of the MS in the GPRS network is updated by initiating a Routing Area Update (RAU) procedure in the MS, wherein said RAU procedure comprises:

sending from said MS to said SSN of the network a RAU request message including a MS Radio Access Capability (RAC) Information Element (IE), which includes a field indicating a new transmission power class of the MS, accepting in said SSN said IE indicating a new transmission power class of the MS included in said MS RAC of the RAU request message, and delivering to said BSS the IE indicating a new transmission power class of the MS, thereby updating the transmission power class information of the MS at the BSS, wherein the delivering to the Base Station (BSS) the IE indicating the new transmission power class of the MS, thereby updating the transmission power class information of the MS at the BSS occurs during a transmission.

11. A packet switched network according to claim 10, wherein said updating is performed upon occurrence of a predetermined state.

12. A packet switched network according to claim 10, wherein said predetermined state occurs when said MS moves to a new Routing Area (RA).

13. A packet switched network according to claim 11, wherein said predetermined state occurs periodically when a timer in the MS reaches a pre-set value.

14. A packet switched network according to claim 10, wherein said RAU request includes one of first information indicating whether said RAU procedure is a normal RAU procedure, second information indicating whether said RAU procedure is a periodic RAU procedure, or third information indicating whether said RAU procedure is a combined RA/Location Area (LA) procedure.

15. A packet switched network according to claim 10, said RAU request includes information of a New Update Type field indicating that said RAU procedure is used for updating the network with new power class information.

16. A packet switched network according to claim 10, wherein said SSN provides new power class information to said BSS.

17. A packet switched network according to claim 10, wherein said SSN can use either a DL Data PDU or RA_Capability_PDU messages to deliver the new power class of the MS to the BSS.

18. A packet switched network according to claim 10, wherein the network is a General Packet Radio Services (GPRS) network and said SSN is a Serving GPRS Support Node (SGSN).

19. A Mobile Station for use in a packet switched network having a function of updating transmission power class information, said network includes a Serving Support Node (SSN), and a Base Station (BSS), said MS comprising:

a Radio Frequency (RF) unit which transmits and receives wireless signals; and a control unit which updates transmission power class information of the MS in the GPRS network by initiating a Routing Area Update (RAU) procedure in the MS, wherein said RAU procedure comprises:

sending from said MS to said SSN of the network a RAU request message including a MS Radio Access Capability (RAC) Information Element (IE), which includes a field indicating a new transmission power class of the MS, accepting in said SSN said IE indicating a new transmission power class of the MS included in said MS RAC of the RAU request message, and delivering to said BSS the IE indicating a new transmission power class of the MS, thereby updating the transmission power class information of the MS at the BSS, wherein the delivering to the Base Station (BSS) the IE indicating the new transmission power class of the MS, thereby updating the transmission power class information of the MS at the BSS occurs during a transmission.

20. A Mobile Station according to claim 19, wherein said updating is performed upon occurrence of a predetermined state.

21. A Mobile Station according to claim 20, wherein said predetermined state occurs when said MS moves to a new Routing Area (RA).

22. A Mobile Station according to claim 20, wherein said predetermined state occurs periodically when a timer in the MS reaches a pre-set value.

23. A Mobile Station according to claim 19, wherein said RAU request includes one of first information indicating whether said RAU procedure is a normal RAU procedure, second information indicating whether said RAU procedure is a periodic RAU procedure, or third information indicating whether said RAU procedure is a combined RA/Location Area (LA) procedure.

24. A Mobile Station according to claim 19, said RAU request includes information of a New Update Type field indicating that said RAU procedure is used for updating the network with new power class information.

25. A Mobile Station according to claim 19, wherein said SSN provides new power class information to said BSS.

26. A Mobile Station according to claim 19, wherein said SSN can use either a DL Data PDU or RA_Capability_ PDU messages to deliver the new power class of the MS to the BSS.

27. A Mobile Station according to claim 19, wherein the network is a General Packet Radio Services (GPRS) network and said SSN is a Serving GPRS Support Node (SGSN).

\* \* \* \* \*